US012073918B2

(12) United States Patent
Wang et al.

(10) Patent No.: US 12,073,918 B2
(45) Date of Patent: Aug. 27, 2024

(54) MEMORY DEVICE DESERIALIZER CIRCUIT WITH A REDUCED FORM FACTOR

(71) Applicant: Micron Technology, Inc., Boise, ID (US)

(72) Inventors: Guan Wang, San Jose, CA (US); Luigi Pilolli, L'Aquila (IT)

(73) Assignee: Micron Technology, Inc., Boise, ID (US)

( * ) Notice: Subject to any disclaimer, the term of this patent is extended or adjusted under 35 U.S.C. 154(b) by 31 days.

(21) Appl. No.: 18/097,668

(22) Filed: Jan. 17, 2023

(65) Prior Publication Data

US 2023/0162770 A1 May 25, 2023

Related U.S. Application Data

(62) Division of application No. 17/340,754, filed on Jun. 7, 2021, now Pat. No. 11,594,268.

(51) Int. Cl.
*G11C 8/00* (2006.01)
*G11C 7/10* (2006.01)
*G11C 7/22* (2006.01)
*H03K 3/356* (2006.01)

(52) U.S. Cl.
CPC .............. *G11C 7/222* (2013.01); *G11C 7/106* (2013.01); *G11C 7/1087* (2013.01); *H03K 3/356095* (2013.01)

(58) Field of Classification Search
CPC ...................................... G11C 7/222
USPC ................................. 365/233.1
See application file for complete search history.

(56) References Cited

U.S. PATENT DOCUMENTS 10,902,904 B1   1/2021   Mitsubori

*Primary Examiner* — Hoai V Ho
(74) *Attorney, Agent, or Firm* — Lowenstein Sandler LLP

(57) ABSTRACT

A memory sub-system including a memory device, wherein the memory device includes a circuit, operatively coupled to an array data bus of a memory array, and control logic, operatively coupled with the circuit, to perform operations including: deserializing a serial data stream in a first time domain to generate at least one of a set of rising data portions or a set of falling data portions; and synchronizing the at least one of the set of rising data portions or the set of falling data portions in a second time domain using at least one of a set of rising edge clock signals or a set of falling edge clock signals generated by a ring counter portion.

20 Claims, 9 Drawing Sheets

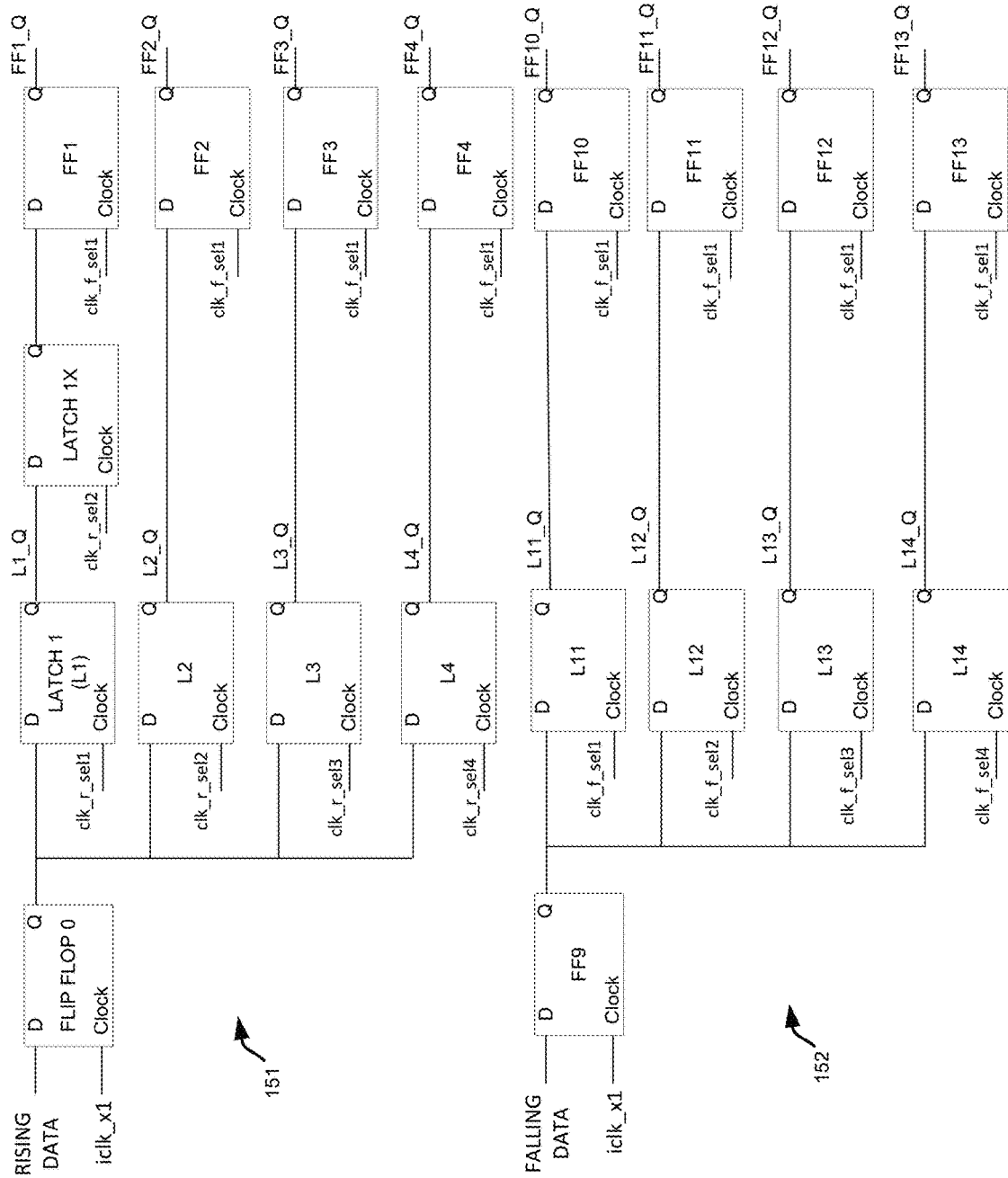

MEMORY DEVICE DESERIALIZER CIRCUIT WITH A REDUCED FORM FACTOR

RELATED APPLICATIONS

The present application is a divisional of and claims priority to U.S. patent application Ser. No. 17,340,754, filed on Jun. 7, 2021, entitled "Memory Device Deserializer Circuit with a Reduced Form Factor," the entire contents of which are incorporated by reference herein.

TECHNICAL FIELD

Embodiments of the disclosure relate generally to memory sub-systems, and more specifically, relate to a memory device deserializer circuit with a reduced form factor.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 4 illustrates an example rising data circuit portion and falling data circuit portion of a ring counter-based deserializer circuit, in accordance with embodiments of the present disclosure.

DETAILED DESCRIPTION

Figure 1:
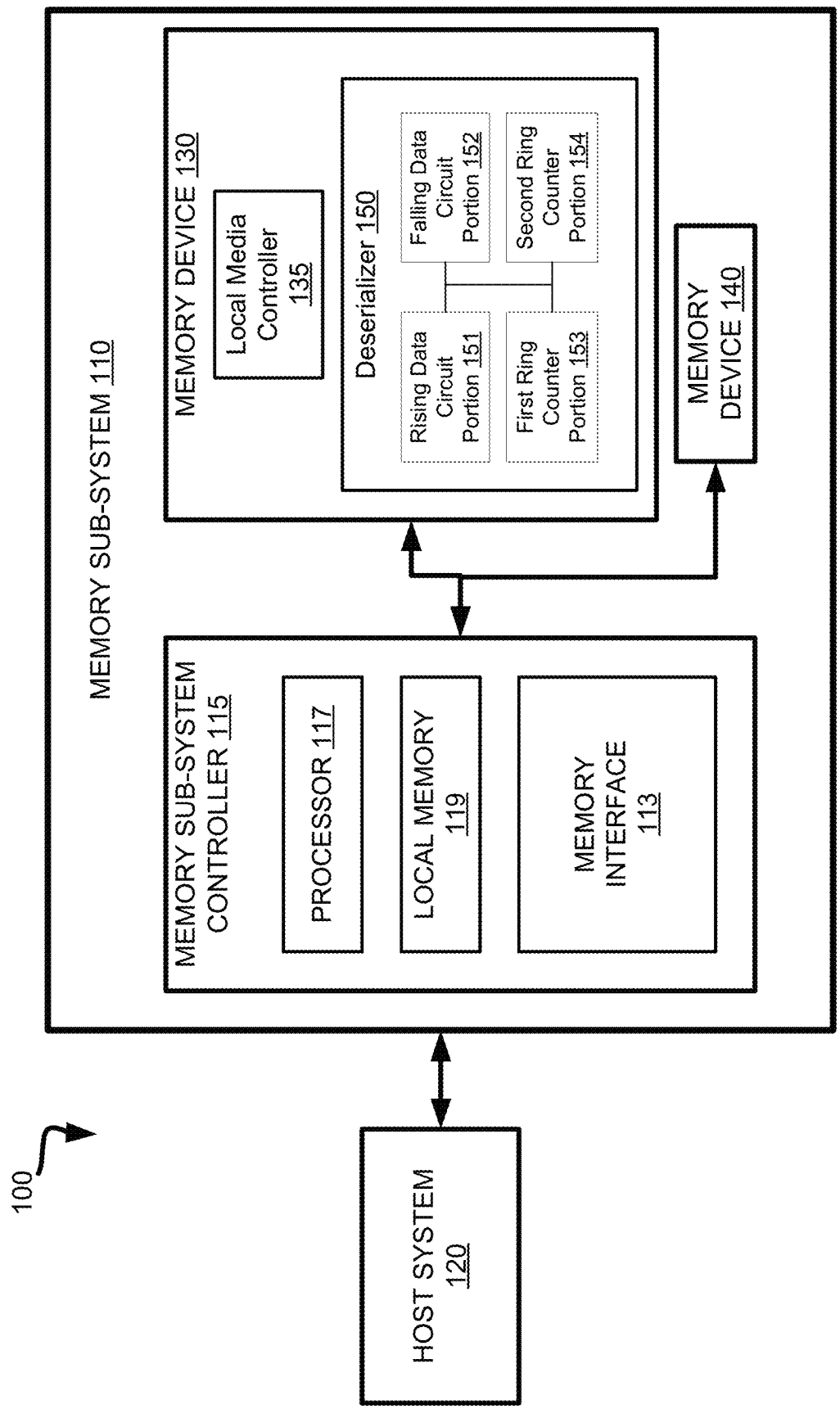
FIG. 1 illustrates an example computing system that includes a memory sub-system, in accordance with some embodiments of the present disclosure.

Aspects of the present disclosure are directed to a memory device deserializer circuit with a reduced form factor. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include one or more planes. For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

A host system may initiate a memory access operation (e.g., a program operation) associated with the memory array. The memory device includes a serial input/output (I/O) interface including a series of I/O pads operatively coupled to a memory controller of a memory sub-system. The pads are used to provide a serial high-frequency input data stream for transmission of data via an input data bus to the memory array. In some memory devices, a deserializer circuit is used to enable the movement of data from the serial input data stream to a wide bit-width array bus of the memory array. The deserializer circuit receives a high speed serial data via a serial data bus (e.g., an 8-bit bus) and converts the serial data from the input data bus to an N-bit (e.g., 64 bit, 128 bit, etc.) parallel low speed data stream.

The data stream of the serial data bus includes multiple signals including a data signal (e.g., DQ) and a strobe or clock signal (e.g., DQS). The data (e.g., a data byte) is sent out on each edge of the clock which is used to synchronize the data (e.g., a first data byte is synchronized with a first rising edge of the clock, a second data byte is synchronized with a first falling edge of the clock, a third data byte is synchronized with a second rising edge of the clock, a fourth data byte is synchronized with a second falling edge of the clock, and so on).

For example, a typical 1 to 8 deserializer can be used to manage the input path between an 8-bit serial input data bus and a 64-bit parallel array data bus. In other examples, a 1 to 16 deserializer can be used to manage the input path between an 8-bit serial input data bus and a 128-bit parallel array data bus, and so on. The deserializer supports multiple frequencies domains (e.g., an x1 frequency domain, an x2 frequency domain, and an x4 frequency domain) each including a number of circuit elements to deserialize and synchronize the data stream of rising data and falling data.

Prior to the deserialization process, some memory devices include multiple flip-flop (FF) circuits in the x1 domain to synchronize the rising data and the falling data. Each flip-flop circuit includes a pair of latch (L) circuits configured as an edge-triggered device that changes state when a control signal (e.g., a clock signal) goes from high to low or low to high. In operation, each flip-flop circuit is sensitive to pulse transitions and only propagates through (e.g., outputs) on the rising or falling edge of the clock pulse. In these memory devices, the multiple flip-flop circuits are used to synchronize the data by temporarily latching or storing respective data bits of the data input data stream prior to passing the data to the deserializer.

In addition, each of the flip-flop circuits are associated with a delay time (tclk2q) and a setup time (e.g., a minimum time required to latch the correct data in a flip-flop). Since typical deserializers synchronize the rising and falling data in the high-frequency x1 domain prior to deserialization, a critical path (e.g., a path from input to output with a greatest delay) is formed. For example, to ensure efficient and accurate data transmission, a sum of the delay time (tclk2q) and the setup time (tsetup) of the flip-flops in the synchronization stage in the x1 domain must be less than one-half of the clock period (tck) (i.e., a time from one rising edge to a next rising edge). In this regard, the typical deserializer that synchronizes in the x1 domain (e.g., synchronizes before deserialization) results in a strict critical path requirement that is based on a half clock period (e.g., tclk2q+tsetup<0.5tck).

The synchronized rising and falling data stream generated by the set of flip-flop circuits in the x1 domain are provided to the deserializer circuit for deserialization and a second stage of synchronization. The deserializer includes another set of flip-flop circuits configured to deserialize and synchronize the rising and falling data. For example, in order to manage the different frequency domains, the deserializer uses a primary or reference clock (e.g., iclk_x1) that is processed by a clock divider to generate a double period clock signal (e.g., iclk_x2) in the X2 domain and a four period clock signal (e.g., iclk_x4) in the x4 domain. The bit values of the synchronized rising and falling data stream (e.g., one DQ) are stored by the multiple flip-flops and synchronized in the x4 domain using the four period clock signal.

Disadvantageously, for a typical 1 to 16 deserializer, this approach requires the use of a large number of flip-flop circuits (e.g., approximately 45 flip-flops). Since each flip-flop circuit includes a pair of latch circuits, each flip-flop has twice as many gates as a latch circuit. Accordingly, the large number of flip-flops employed in a typical deserializer configuration has a correspondingly large form factor that consumes a significant portion of the available physical area within the memory device. This presents a problem in view of the increasing demand for a reduction in the circuit area (e.g., a height of the circuits of the array). Deserializers with a large form factor (in both the x and y directions) due to the large number of flip-flop circuits increase data path power consumption and reduce input/output speeds. In addition to the physical space consumption, a typical deserializer circuit can consume approximately 50% of the available peak current level of a data bus burst write current in a memory device.

Moreover, the expansion of memory array sizes results in an increasing demand on area management, power reduction and peak current consumption. However, as described above, typical deserializer circuits require the use of a large number of flip-flop circuits to convert the data stream of the input data bus into multiple parallel streams for transmission via the array data bus, which results in a high level of area, power and peak current consumption.

Aspects of the present disclosure address the above and other deficiencies by implementing a ring counter-based deserializer circuit to convert data received via a serial input bus to a format suitable for a parallel bus of a memory array in a memory device. In one embodiment, a ring counter circuit portion is used to generate and manage a set of clock signals for use in deserializing and synchronizing rising data and falling data of a data stream via an input path between a serial input bus and an N-bit parallel array data bus. In an embodiment, the ring counter circuit portion includes a first ring counter portion including a first set of flip-flops (FFs) connected to a shift register to manage a set of clock signals associated with the rising edges of a primary or reference clock signal (herein also referred to as "iclk_x1" or "reference clock") having a highest frequency. The reference clock including a series of rising edges and falling edges is provided as a clock signal to each of the first set of flip-flops of the first ring counter portion. In the ring counter-based configuration, each of the flip-flops generates an output corresponding to a rising edge clock signal (e.g., clk_r_sel1, clk_r_sel2, clk_r_sel3, and clk_r_sel4).

In an embodiment, the ring counter circuit portion 310 of the ring counter-based deserializer circuit 300 includes a second ring counter portion 154 including a second set of flip-flops connected to a shift register to manage a set of clock signals associated with the falling edges of the reference clock waveform. Each of the second set of flip-flops generates as an output corresponding to a falling edge clock signal (e.g., clk_f_sel1, clk_f_sel2, clk_f_sel3, and clk_f_sel4).

In an embodiment, the ring counter-based deserializer circuit 300 uses the rising edge clock signals and falling edge clock signals generated by the first ring counter portion 153 and the second ring counter portion 154 to separately deserialize the rising data (e.g., a rising data stream including portions D0, D2, D4, and D6) and the falling data (e.g., a falling data stream including portions D1, D3, D5, and D7). In an embodiment, following the separate deserializing of the rising data and the falling date, the deserialized rising data set and the deserialized falling data set are synchronized using a common clock signal (e.g., clk_f_sel1) to generate the synchronized data stream that is provided to the memory array 304 via the array data bus 303. Aspects of the first ring counter portion 153 and the second ring counter portion 154 of the ring counter portion 310 are described in greater detail below with reference to FIG. 3B.

In an embodiment, the ring counter-based deserializer circuit uses sets of latches to deserialize the rising data and the falling data separately and prior to synchronization. Use of latch circuits in the deserialization stage, which have fewer gates and a smaller area than a flip-flop, reduces the number of flip-flops in the circuit as compared to typical deserializer circuits. The reduced number of flip-flops results in a reduction in the area, power, and peak current consumed by the ring counter-based deserializer circuit. In addition, the ring counter-based deserializer circuit improves the management of the timing requirements by performing one clock domain transfer. Furthermore, the deserializing of the rising and falling prior to synchronization establishes an improved critical path (e.g., tsetup+ thold<tck) as compared to the one-half clock period critical path constraint of the typical deserializer circuit. Accordingly, the critical path with the one-half clock period (tck) margin is removed by employing the ring counter-based deserializer circuit in accordance with embodiments of the present disclosure.

A further advantage is realized by sharing the ring counter circuit portions of the ring counter-based deserializer with multiple rising/falling data circuit portions. The sharing of the ring counter circuit portions by multiple rising/falling data circuit portions enables a further reduction in the area consumed by the corresponding circuitry. For example, a set of four data streams (e.g., four DQ) can share one ring counter portion, thereby reducing the area consumed by the deserializer circuit circuitry according to embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In an embodiment, the memory device 130 includes a deserializer circuit 150 to deserialize an input data stream provided by the host system 120 via a serial input data bus for provisioning to a memory cell array of the memory device 130. According to embodiments, the deserializer circuit 150 includes a rising data circuit portion 151, a falling data circuit portion 152, a first ring counter portion 153 and a second ring counter portion 154 configured to execute a first stage during which rising data and falling data of an input data stream are deserialized separately and a second stage during which the deserialized rising and falling data are synchronized for output to the memory cell array (e.g., the array of memory cells 204 of FIG. 2).

In an embodiment, the rising data circuit portion 151 includes a first set of high-level pass latch circuits (referred to herein as a "latch" or "latches" or represented as "L" in the figures) configured to turn on and pass the rising data via a corresponding output in a sequential manner to deserialize the rising data based on the sequence of rising edges of the reference clock waveform. In an embodiment, the falling data circuit portion 152 includes a second set of latches configured to turn on and pass the falling data via a corresponding output in a sequential manner to deserialize the falling data based on the sequence of falling edges of the reference clock waveform.

In an embodiment, the rising data portions (e.g., D0, D2, D4, D8, etc.) are passed in sequence by the first set of latches based on the rising edge clock signals to a corresponding first set of flip-flops. In an embodiment, the falling data portions (e.g., D1, D3, D5, D7, etc.) are passed in sequence by the second set of latches based on the falling edge clock signals to a corresponding first set of flip-flops.

In an embodiment, after a number of cycles (e.g., 4 cycles), a synchronization stage is executed where the rising data portions (e.g., D0, D2, D4, and D6) corresponding to the first set of flip-flops of the rising circuit portion) and falling data portions (D1, D3, D5, and D7) corresponding to the second set of flip-flops of the falling circuit portion are latched together as a single output to the memory array in one clock cycle using a common clock signal (e.g., clk_f_sel1)).

In an embodiment, since the outputs of the flip-flops including the deserialized rising data and falling data are latched and synchronized based on the common falling clock signal (clk_f_sel1), the output of a first latch (L1) is fed to an input of an auxiliary latch (L1X) to ensure an appropriate hold time margin (e.g., since a second cycle of the clk_r_sel1 signal occurs before the synchronization or latching of the rising and falling data portions based on the common clock signal (e.g., clk_f_sel1)). In an embodiment, the auxiliary latch (L1X) is clocked (e.g., receives a clock signal) based on a second rising edge (e.g., clk_r_sel2) of the reference clock waveform.

In one embodiment, the first ring counter portion 153 and the second ring counter portion 154 are configured to manage a set of clock signals for use by the rising data circuit portion 151 and the falling data circuit portion 152 in deserializing and synchronizing the rising data and the falling data received via a serial input bus for output to an N-bit (e.g., 64-bit, 128-bit, etc.) parallel array data bus.

Figure 3A:
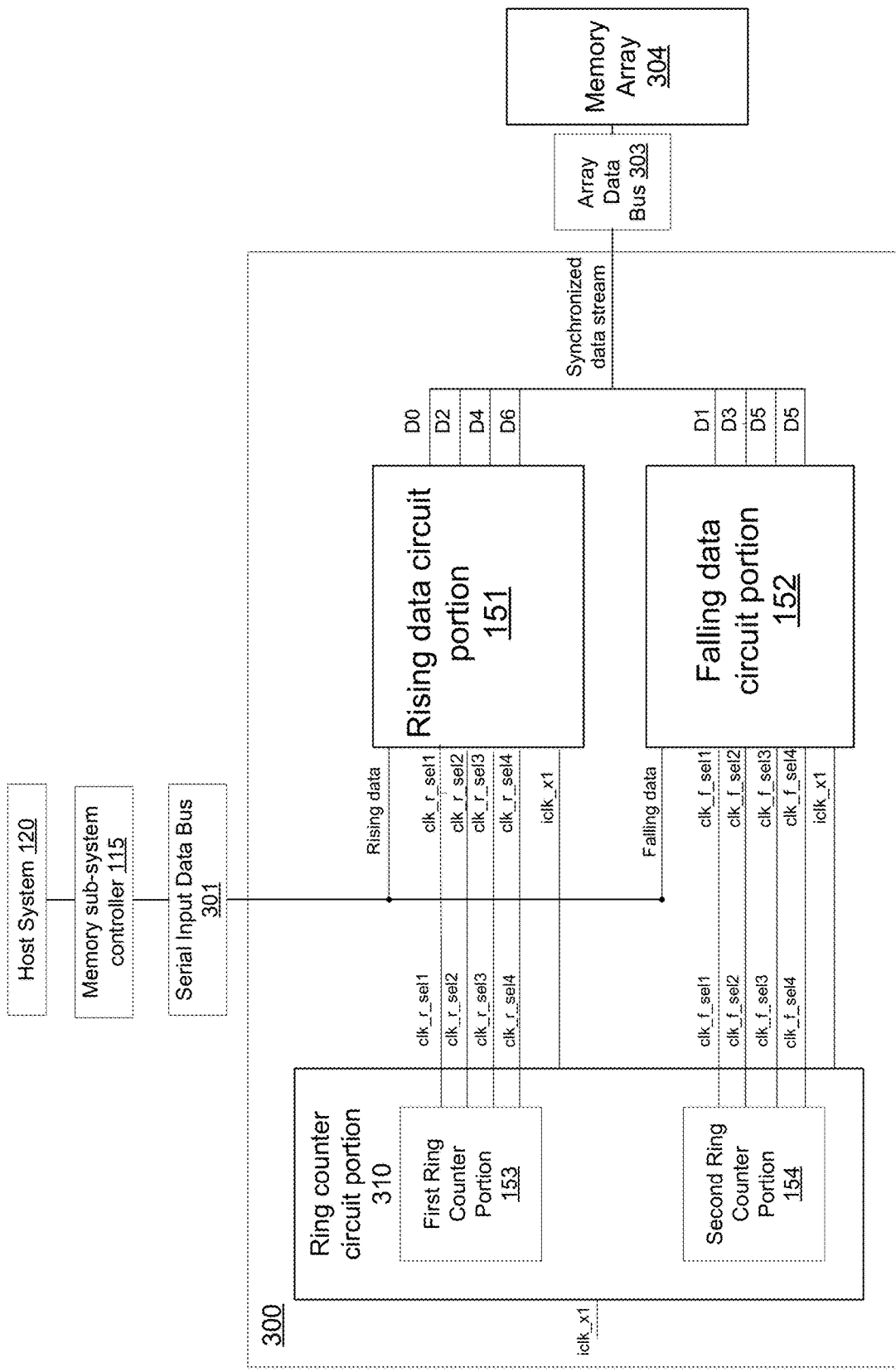
FIG. 3A is a schematic illustration of an example ring counter-based deserializer circuit, in accordance with embodiments of the present disclosure.
Figure 3B:
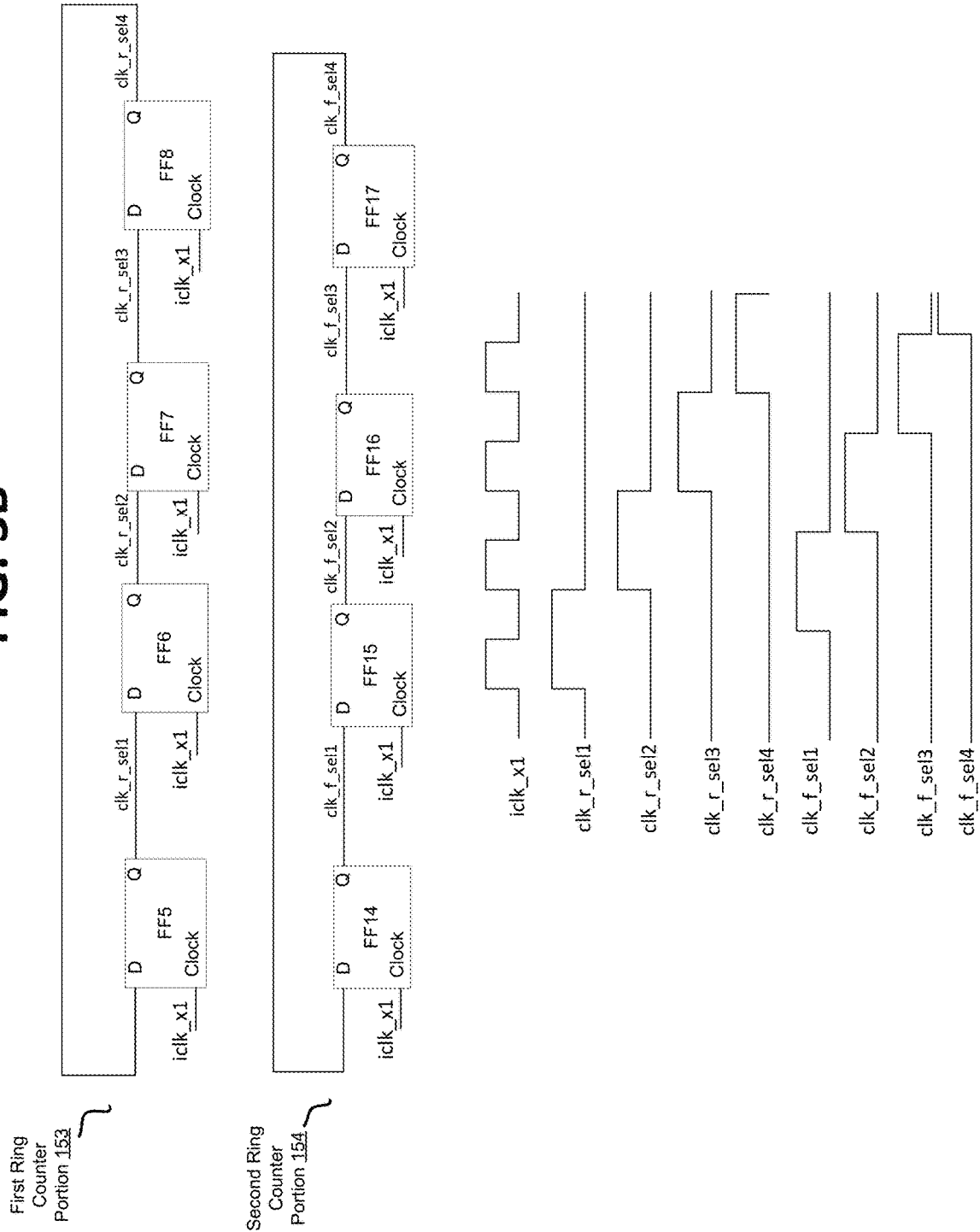
FIG. 3B is a schematic illustration of an example first ring counter portion and second ring counter portion of a ring counter-based deserializer circuit and corresponding clock signals, in accordance with embodiments of the present disclosure.

In an embodiment, the first ring counter portion 153 includes a first set of flip-flops connected into a shift register is manage a set of clock signals associated with the rising edges of a reference clock signal (iclk_x1). In an embodiment, the second ring counter portion 154 includes a second set of flip-flops connected into a shift register is manage a set of clock signals associated with the falling edges of the reference clock signal (iclk_x1). The first ring counter portion 153 and the second ring counter portion 154 are described below in greater detail with reference to FIGS. 3A and 3B. It is noted that FIGS. 3A and 3B depict a simplified version of the circuits according to embodiments of the present disclosure (e.g., various set/reset pins of the flip-flops are not shown in FIGS. 3A and 3B).

In an embodiment, the deserializer circuit 150 uses the rising edge clock signals and falling edge clock signals generated by the first ring counter portion 153 and the second ring counter portion 154 to separately deserialize the rising data (e.g., a rising data stream including portions D0, D2, D4, D6, D8, etc.) and the falling data (e.g., a falling data stream including portions D1, D3, D5, D7 etc.). In an embodiment, following the separate deserializing of the rising data and the falling date, the deserializer circuit 150 synchronizes the deserialized rising data set and the deserialized falling data using a common clock signal (e.g., clk_f_sel1).

In an embodiment, the rising data circuit portion 151 includes a first set of high-level pass latch circuits configured to turn on and pass the rising data via a corresponding output in a sequential manner to deserialize the rising data based on the sequence of rising edges of the reference clock waveform.

In an embodiment, the rising data circuit portion 151 includes a set of flip-flops having data inputs that correspond to the outputs of the latches of the rising data circuit portion 151. The flip-flops of the rising data circuit portion 151 are configured to store a corresponding deserialized rising data portion during a deserialization stage. In an embodiment, the falling data circuit portion 152 includes a set of flip-flops having data inputs that correspond to the outputs of the latches of the falling data circuit portion 152. The flip-flops of the falling data circuit portion 151 are configured to store a corresponding deserialized falling data portion during a deserialization stage.

In an embodiment, during a synchronization stage, the respective flip-flops of the rising data circuit portion 151 and the falling data circuit portion 152 synchronize the respective deserialized rising and falling data portions for output to the memory array of the memory device 130. The operation of the rising data circuit portion 151 and the falling data circuit portion 152 are described in greater detail below with respect to FIGS. 3A-7.

Figure 2:
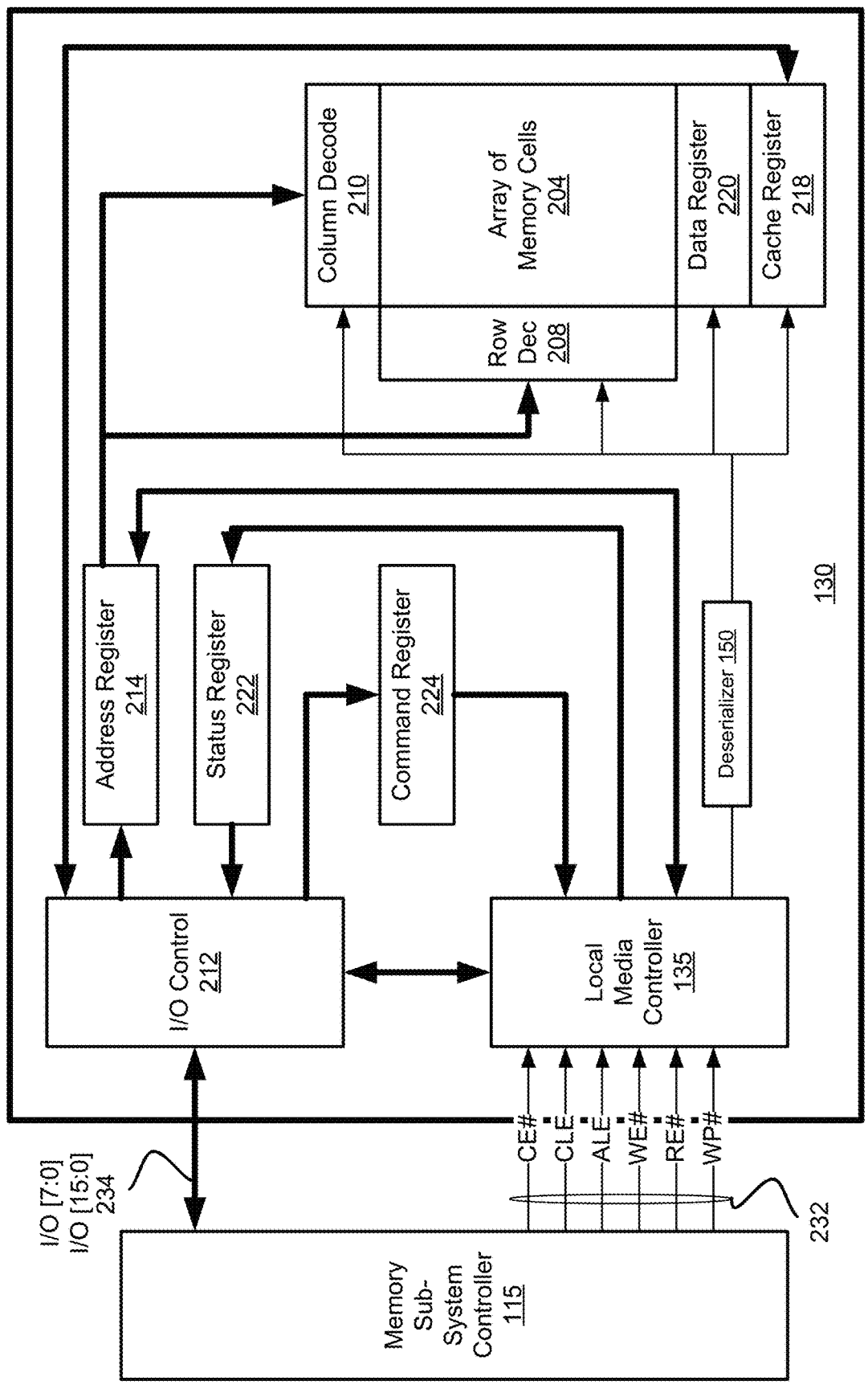
FIG. 2 is a block diagram of a memory device in communication with a memory sub-system controller of a memory sub-system, in accordance with some embodiments of the present disclosure.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 135 includes instructions which can be executed in connection with the operations and functions of the deserializer circuit 150 of memory device 130, as described herein.

The local media controller 135 is in communication with the deserializer circuit 150 of I/O control 212 in accordance with embodiments of the present disclosure. The deserializer circuit 150 manages the input path from memory sub-system controller 115 and the array of memory cells 204. In an embodiment, the deserializer circuit 150 converts the serial input data stream received via from the memory sub-system controller 115 into deserialized set of parallel data portions for output to a parallel interface bus of the array of memory cells 204. In an embodiment, the deserializer circuit 150 can be disposed between the I/O pads or pins of memory device 130 and the array of memory cells 204 and configured to receive the serial input data stream from the I/O pads and convert the serial input data stream to a deserialized set of parallel data portions that are output to the array of memory cells 204 via the array bus.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 220 for transfer to the array of memory cells 204; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE#, a command latch enable signal CLE, an address latch enable signal ALE, a write enable signal WE#, a read enable signal RE#, and a write protect signal WP#. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 218. The data may be subsequently written into data register 220 for programming the array of memory cells 204.

In an embodiment, cache register 218 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

FIG. 3A is a schematic illustration of an example ring counter-based deserializer 300 in accordance with embodiments of the present disclosure. As shown, the ring counter-based deserializer 300 manages the data path between a serial input data bus 301 and a parallel array data bus 303 to enable the transmission of data originating from a host system 120 and transmitted via a memory sub-system controller 115 to a memory array 304.

In one embodiment, the ring counter-based deserializer circuit 300 includes a ring counter circuit portion 310 to generate and manage a set of clock signals for use in deserializing and synchronizing rising data and falling data of a data stream provided by the host system 120 via an input path between the serial input data bus 301 and the array data bus 303 (e.g., an N-bit parallel array data bus). In an embodiment, the ring counter circuit portion 310 includes a first ring counter portion 153 including a first set of flip-flops (FFs) (not shown) connected to a shift register to manage a set of clock signals associated with the rising edges of a primary or reference clock signal (iclk_x1) having a highest frequency. The reference clock including a series of rising edges and falling edges is provided as a clock signal to each of the first set of flip-flops of the first ring counter portion 310. In the ring counter-based configuration, each of the flip-flops generates an output corresponding to a rising edge clock signal (e.g., clk_r_sel1, clk_r_sel2, clk_r_sel3, and clk_r_sel4), where an output of the last flip-flop (e.g., a fourth flip-flop) in the set is fed to the input of the first flip-flop.

In an embodiment, the ring counter circuit portion of the ring counter-based deserializer circuit includes a second ring counter portion includes a second set of flip-flops connected to a shift register to manage a set of clock signals associated with the falling edges of the reference clock waveform. Each of the second set of flip-flops generates an output corresponding to a falling edge clock signal (e.g., clk_f_sel1, clk_f_sel2, clk_f_sel3, and clk_f_sel4), where an output of the last flip-flop in the set is fed to the input of the first flip-flop. In an embodiment, the ring counter portions of the deserializer establish a critical path requirement based on a full clock period (e.g., tsetup+thold<tck).

In an embodiment, the deserializer circuit uses the rising edge clock signals and falling edge clock signals generated by the first ring counter portion and the second ring counter portion to separately deserialize the rising data (e.g., a rising data stream including portions D0, D2, D4, D6, D8, etc.) and the falling data (e.g., a falling data stream including portions D1, D3, D5, D7 etc.). In an embodiment, following the separate deserializing of the rising data and the falling date, the deserialized rising data set and the deserialized falling data set are synchronized using a common clock signal (e.g., clk_f_sel1).

In an embodiment, the deserializer circuit 300 includes a first circuit portion 151 including a first set of high-level pass latch circuits (herein referred to as a "latch") configured to turn on and pass the rising data via a corresponding output in a sequential manner to deserialize the rising data based on the sequence of rising edges of the reference clock waveform.

In an embodiment, the deserializer circuit includes a second circuit portion (also referred to as the "falling data circuit portion") including a second set of latches configured to turn on and pass the falling data via a corresponding output in a sequential manner to deserialize the falling data based on the sequence of falling edges of the reference clock waveform.

In an embodiment, the rising data portions (e.g., D0, D2, D4, D8, etc.) are passed in sequence by the first set of latches based on the rising edge clock signals to a corresponding first set of flip-flops. In an embodiment, the falling data portions (e.g., D1, D3, D5, D7, etc.) are passed in sequence by the second set of latches based on the falling edge clock signals to a corresponding first set of flip-flops. Advantageously, the rising data and the falling data are deserialized during this stage, prior to synchronization.

In an embodiment, after a number of cycles (e.g., 4 cycles), a synchronization stage is executed where the rising data portions (e.g., D0, D2, D4, and D6) corresponding to the first set of flip-flops of the rising circuit portion) and falling data portions (D1, D3, D5, and D7) corresponding to the second set of flip-flops of the falling circuit portion are latched together as a single output to the memory array in one clock cycle using a common clock signal (e.g., clk_f_sel1)).

In an embodiment, since the outputs of the flip-flops including the deserialized rising data and falling data are latched and synchronized based on the common falling clock signal (clk_f_sel1), the output of a first latch (L1) is fed to an input of an auxiliary latch (L1X) to ensure an appropriate hold time margin (e.g., since a second cycle of the clk_r_sel1 signal occurs before the synchronization or latching of the rising and falling data portions based on the common clock signal (e.g., clk_f_sel1)). In an embodiment, the auxiliary latch (L1X) is clocked (e.g., receives a clock signal) based on a second rising edge (e.g., clk_r_sel2) of the reference clock waveform.

FIG. 3B is a schematic illustration of an example first ring counter portion 153 and a second ring counter portion 154 of a deserializer circuit (e.g., deserializer circuit 150 of FIGS. 1 and 2), in accordance with embodiments of the present disclosure. As shown in FIG. 3B, the first ring counter portion 153 includes a first set of flip-flops (FF5, FF6, FF7, FF8) in a ring counter configuration. The first ring counter portion 153 is configured to provide clock signals corresponding to the rising edges of the reference clock (iclk_x1). As shown in FIG. 3, the waveform of the reference clock (iclk_x1) includes a series of rising edges and falling edges is provided as a clock signal to each of the first set of flip-flops of the first ring counter portion 153 and the second ring counter portion 154. In an embodiment, each of the flip-flops of the first ring counter portion generates an output corresponding to a rising edge clock signal (e.g., clk_r_sel1, clk_r_sel2, clk_r_sel3, and clk_r_sel4), where an output of the last flip-flop (e.g., a fourth flip-flop) in the set is fed to the input of the first flip-flop (e.g., FF5) following a fourth cycle of the reference clock. In an embodiment, when the waveform of the reference clock (iclk_x1) is toggling, the output of each counter bit goes high (rises) and each flip-flop turns on one-by-one.

In an embodiment, the second ring counter portion 154 includes a second set of flip-flops (e.g., FF14, FF15, FF16, and FF17) connected into a shift register to manage a set of clock signals associated with the falling edges of the reference clock waveform. Each of the second set of flip-flops generates an output corresponding to a falling edge clock signal (e.g., clk_f_sel1, clk_f_sel2, clk_f_sel3, and clk_f_sel4), where an output of the last flip-flop (e.g., FF18) in the set is fed to the input of the first flip-flop (e.g., FF14) following a fourth cycle of the reference clock.

FIG. 4 illustrates an example rising data circuit portion 151 and falling data circuit portion 152 of the deserializer circuit 150, according to embodiments of the present disclosure. It is noted that FIG. 4 depicts a simplified version of the circuits according to embodiments of the present disclosure (e.g., various set/reset pins of the flip-flops are not shown in FIG. 4). As shown in FIG. 4, the rising data circuit portion 151 includes a first flip-flop (FF0) that receives as an input the rising data of the input data stream and the reference clock (iclk_x1) having a highest frequency. In an embodiment, the rising data of the input data stream includes data portions D0, D2, D4, and D6 received during four cycles of the reference clock. As illustrated, the rising data circuit portion 151 includes a first set of high-level pass latch circuits (herein referred to as a "latch" or "latches") configured to receive the rising data from FF0 and turn on and pass the rising data via a corresponding output in a sequential manner to deserialize the rising data based on the sequence of rising edges of the reference clock waveform. In an embodiment, a first latch (L1) is configured to pass or output a first portion of the rising data ("D0") in response to a first rising clock edge signal (e.g., clk_r_sel1), a second latch (L2) is configured to pass a second portion of the rising data ("D2") in response to a second rising clock edge signal (e.g., clk_r_sel2), a third latch (L3) is configured to pass a third portion of the rising data ("D4") in response to a third rising clock edge signal (e.g., clk_r_sel3), and a fourth latch (L4) is configured to pass a fourth portion of the rising data ("D6") in response to a fourth rising clock edge signal (e.g., clk_r_sel4).

As illustrated in FIG. 4, rising data circuit portion 151 includes a set of flip-flops (e.g., FF1-FF4) coupled to the outputs of respective outputs of the first set of latches. In an embodiment, In an embodiment, since the outputs of the flip-flops including the deserialized rising data and falling data are latched based on the common falling clock signal (clk_f_sel1), as described below, the output of the first latch (L1) is fed to an input of an additional or auxiliary latch (L1X) to ensure an appropriate hold time margin is maintained. In an embodiment, the auxiliary latch (L1X) passes the first data portion (D0) received from the output of L1 and is clocked (e.g., receives a clock signal) based on a second rising edge (e.g., clk_r_sel2) of the reference clock waveform to enable passage of D0 to an input of FF1. According to embodiments, L1X (also referred to as an "auxiliary latch" or "hold time latch") is used to ensure the necessary hold time margin to enable FF1 to store and output the appropriate data portion (e.g., data portion D0 in the example shown).

In an embodiment, L2 passes or outputs the first rising data portion (D2) to an input of FF2 in response to a signal corresponding to a second rising edge of the reference clock (clk_r_sel2). In an embodiment, L3 passes or outputs the first rising data portion (D4) to an input of FF3 in response to a signal corresponding to a third rising edge of the reference clock (clk_r_sel3). In an embodiment, L4 passes or outputs the first rising data portion (D6) to an input of FF4 in response to a signal corresponding to a fourth rising edge of the reference clock (clk_r_sel4). Accordingly, following completion of four cycles of the reference clock, the rising data portions D0, D2, D4, and D6 are deserialized and stored in FF1-FF4, respectively.

As shown in FIG. 4, the deserializer circuit 150 includes the falling data circuit portion 152 including a second portion of latches (e.g., L11-L14) configured to turn on and pass the falling data via a corresponding output in a sequential manner to deserialize the falling data portions of the input data stream. In an embodiment, the second portion of latches of the falling data circuit portion 152 are synchronized by the falling edges of the reference clock and are shifted one-half cycle later than the first portion of latches of the rising circuit portion 151 that are configured to deserialize the rising data.

In an embodiment, the falling data circuit portion 152 includes a first flip-flop (FF9) that receives as an input the falling data of the input data stream and the reference clock (iclk_x1). In an embodiment, the falling data of the input data stream includes data portions D1, D3, D5, and D7 received via the serial data bus during four cycles of the reference clock. As illustrated, the rising falling data circuit portion 152 includes a first second set of latches (L11-L14) configured to receive the falling data from FF9 and turn on and pass the falling data via corresponding outputs in a sequential manner to deserialize the falling data based on the sequence of signals corresponding to the falling edges of the reference clock waveform (e.g., clk_f_sel1 through clk_f_sel4). In an embodiment, a first latch (L11) is configured to pass or output a first portion of the falling data ("D1") in response to the first rising clock edge signal (e.g., clk_f_sel1), a second latch (L12) is configured to pass a second portion of the falling data ("D3") in response to a second rising clock edge signal (e.g., clk_f_sel2), a third latch (L13) is configured to pass a third portion of the falling data ("D5") in response to the third rising clock edge signal (e.g., clk_f_sel3), and a fourth latch (L14) is configured to pass a fourth portion of the falling data ("D7") in response to a fourth rising clock edge signal (e.g., clk_f_sel4). Accordingly, following completion of four cycles of the reference clock, the falling data portions D1, D3, D5, and 7 are deserialized and stored in FF10-FF13, respectively.

In an embodiment, upon completion of the deserializing stage (e.g., after completion of the fourth cycle of the reference clock, as shown in FIG. 3), the deserialized rising data portions are stored in the first set of flip-flops (e.g., FF1-FF4) and the falling data portions (D1, D3, D5, and D7) are stored in the second set of flip-flops (e.g., FF10-FF13).

In an embodiment, a synchronization stage is executed wherein the rising data portions and the falling data portions are latched together as a single synchronized output to the memory array. As shown in FIG. 4, the first set of flip-flops (FF1-FF4) of the rising data circuit portion 151 and the second set of flip-flops (FF11-FF14) of the falling data circuit portion 152 are synchronized using a common clock (e.g., clk_f_sel1). In an embodiment, after a number of cycles (e.g., 4 cycles), the rising data portions (e.g., D0, D2, D4, and D6 corresponding to flip-flops FF1-FF4) and falling data portions (D1, D3, D5, and D7) are latched together or synchronized in one clock cycle (e.g., a common clock such as clk_f_sel1)) as a single output to the memory array.

In an embodiment, as described above and shown in FIG. 4, since the outputs of the flip-flops including the deserialized rising data and falling data are latched based on the common falling clock signal (clk_f_sel1), the hold time latch (L1X) is used to ensure an appropriate hold time margin to enable the FF1 to receive and output the appropriate rising data portion (e.g., data portion D0). In an embodiment, the hold time latch (L1X) is clocked (e.g., receives a clock signal) based on a second rising edge (e.g., clk_r_sel2) of the reference clock waveform. Synchronizing using the falling edge (clk_r_sel1).

Advantageously, as illustrated in FIGS. 3 and 4, the deserializer circuit 150 includes sets of latches (L1-L4 and L11-L14) which consume less area, power, and peak current than flip-flop circuits. Accordingly, the form factor of a deserializer circuit 150 (e.g., a 1 to 8 or 1 to 16 deserializer circuit) in accordance with embodiments of the present disclosure is significantly reduced (e.g., an area approximately equivalent to 30 flip-flops) as compared to the form factor of a typical deserializer circuit (e.g., an area approximately equivalent to 30 flip-flops).

Figure 5:
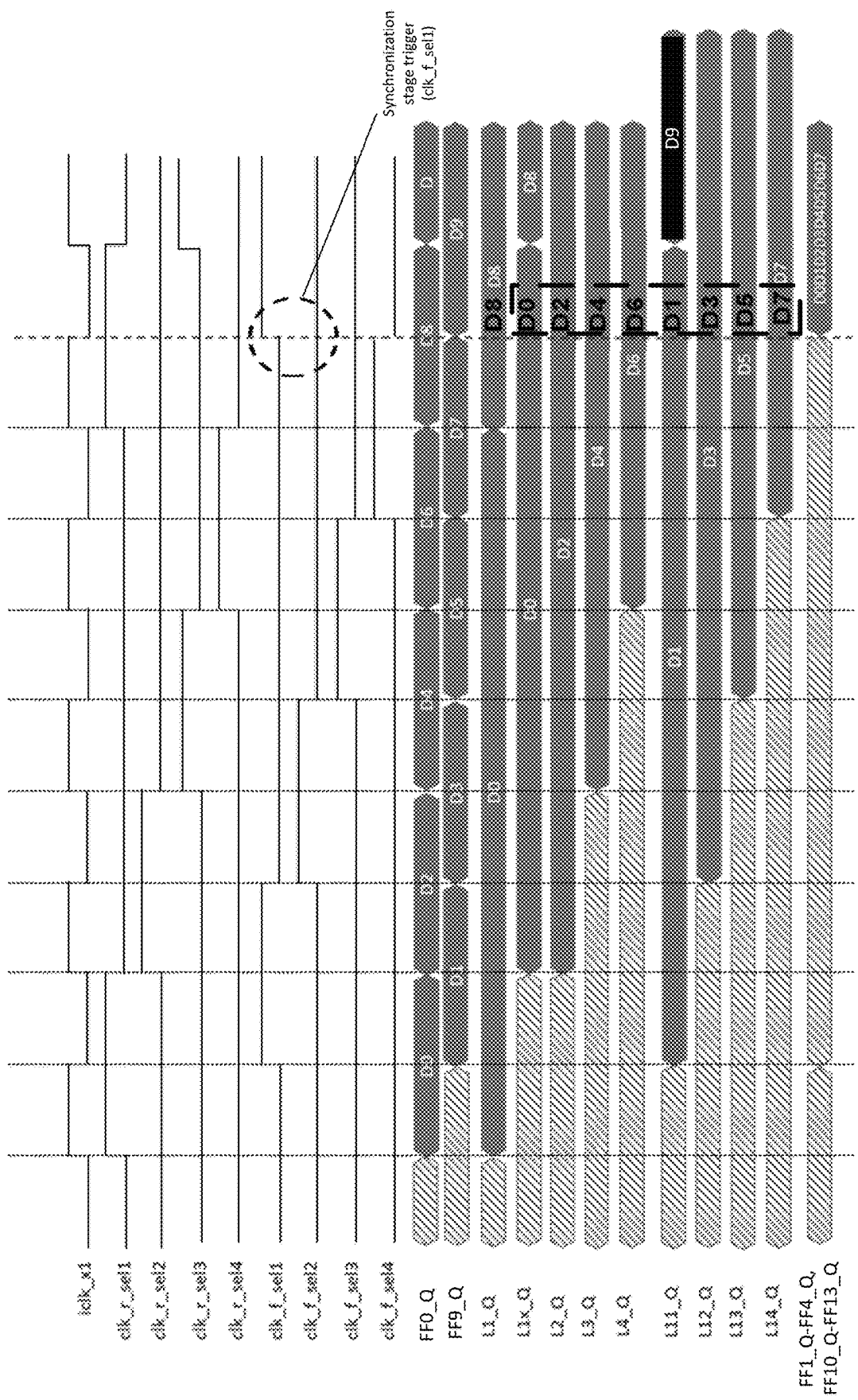
FIG. 5 illustrates clock signal waveforms and states of latch and flip-flop circuits of a ring counter-based deserializer circuit, in accordance with some embodiments of the present disclosure.

FIG. 5 illustrates the clock signal and corresponding latch and flip-flop states in accordance with embodiments of the deserializer circuit 150 of FIGS. 1-4. FIG. 5 illustrates an example waveform of a reference clock (iclk_x1) having a highest frequency along with the corresponding rising edge clock signals (clk_r_sel1, clk_r_sel2, clk_r_sel3, clk_r_sel4) and falling edge clock signals (clk_f_sel1, clk_f_sel2, clk_f_sel3, clk_f_sel4) in accordance with the ring counter-based deserializer circuit 150 of FIGS. 1-4.

FIG. 5 also depicts the respective outputs of the flip-flop (F0_Q) and latches (L1_Q, L1X_Q, L2_Q, L3_Q, and L4_Q) of the rising data circuit portion 151 of the deserializer circuit 150 in accordance with embodiments of the present disclosure. As shown, the output of FF0 (FF0_Q) includes the rising data portions (D0, D2, D4, D6, D8, etc.) triggered by the rising edges of the reference clock, wherein D0 is passed in response to clock signal clk_r_sel1, D2 is passed in response to clock signal clk_r_sel2, D4 is passed in response to clock signal clk_r_sel3, and so on. These rising data portions are provided as inputs to the latches (L1-L4) of the rising data circuit portion 151 to generate the corresponding latch outputs (L1_Q, L1X_Q, L2_Q, L3_Q, and L4_Q) in accordance with the respective rising edge clock signals (e.g., clk_r_sel1, clk_r_sel2, clk_r_sel3, clk_r_sel4).

FIG. 5 also depicts the respective outputs of the flip-flop (F9_Q) and latches (L1_Q, L11_Q, L12_Q, L13_Q, and L14_Q) of the falling data circuit portion 152 of the deserializer circuit 150 in accordance with embodiments of the present disclosure. As shown, the output of FF10 (FF10_Q) includes the falling data portions (D0, D2, D4, D6, D8, etc.) triggered by the falling edges of the reference clock (e.g., a one-half cycle delay as compared to FF0), wherein D1 is passed in response to clock signal clk_f_sel1, D3 is passed in response to clock signal clk_f_sel2, D5 is passed in response to clock signal clk_f_sel3, and so on. These falling data portions are provided as inputs to the latches (L11-1) of the falling data circuit portion 152 to generate the corresponding latch outputs (L11_Q, L12_Q, L13_Q, and L14_Q) in accordance with the respective rising edge clock signals (e.g., clk_r_sel1, clk_r_sel2, clk_r_sel3, clk_r_sel4).

As shown in FIG. 5, a synchronization stage is triggered (e.g., using clk_f_sel1) wherein the data portions of the first set of flip-flops of the rising data circuit portion 151 (e.g., FF1-FF4) and the second set of flip-flops of the falling data circuit portion 152 (e.g., FF10-1FF13) are latched together to form a synchronized output stream including D0-D7 for input into the array bus of the memory array. Advantageously, the accurately synchronized data stream including the rising and falling data portions is outputted by the deserializer circuit 150, while realizing an overall reduction in area, power, and peak current consumption as compared to typical deserializer circuit configurations. As illustrated in FIG. 5, to avoid the latching of rising data portion D8 (e.g., the output of L1_Q) at the time of the synchronization triggering (e.g., clk_f_sel1), the output of the hold time latch circuit (L1X_Q) is latched instead (e.g., rising data portion D0) to ensure that D0 is latched instead of D8 (the output of L1_Q at the time of the synchronization).

Figure 6:
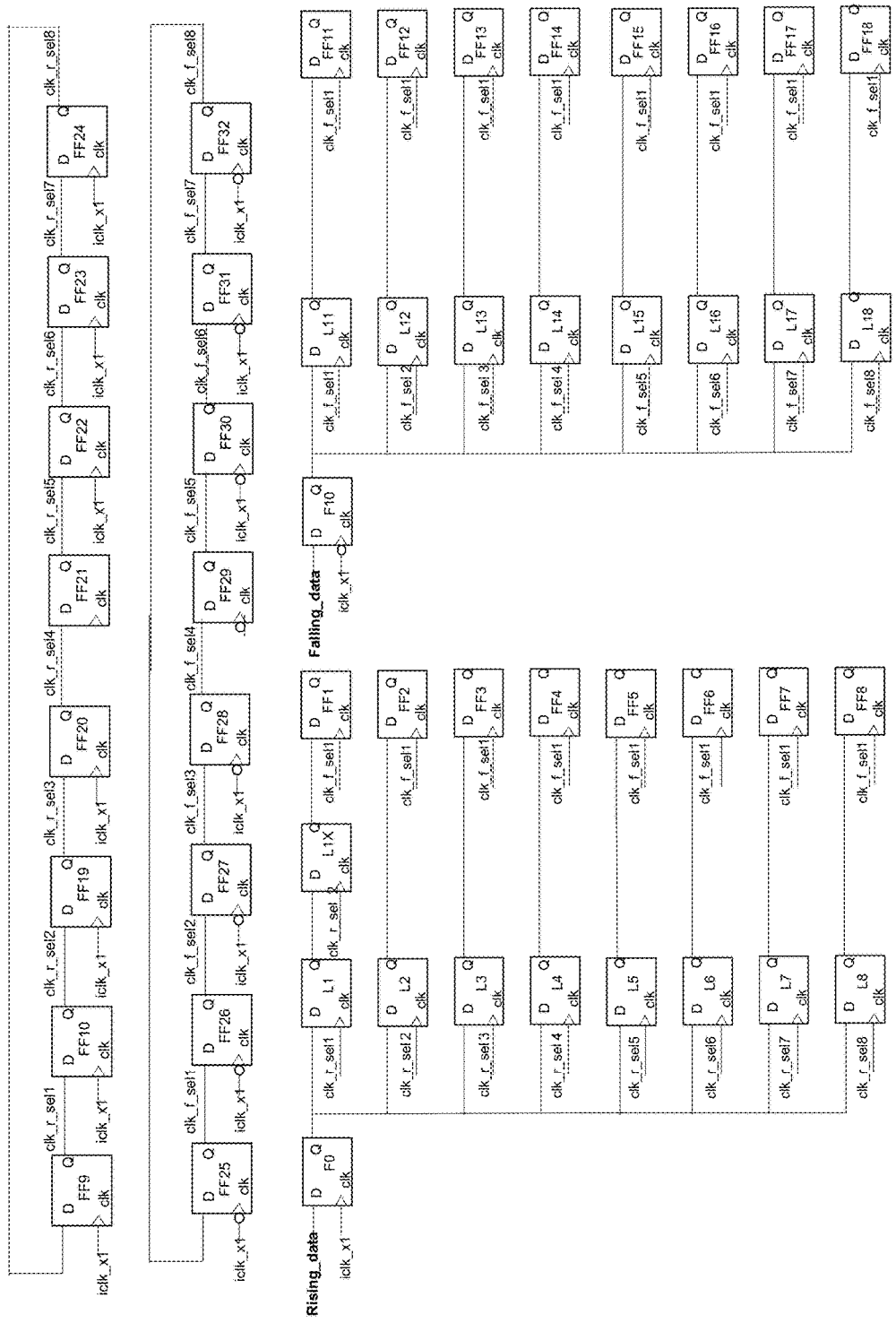
FIG. 6 illustrates an example of 1 to 16 ring counter-based deserializer, in accordance with some embodiments of the present disclosure.

FIG. 6 illustrates an example of 1 to 16 ring counter-based deserializer circuit 600, in accordance with some embodiments of the present disclosure. According to embodiments, the circuit design according to embodiments of the present disclosure can be extended to provide for different levels of deserializing (e.g., 1 to 16, 1 to 32, 1 to N), such as the 1 to 16 deserializing as shown in FIG. 6.

Figure 7:
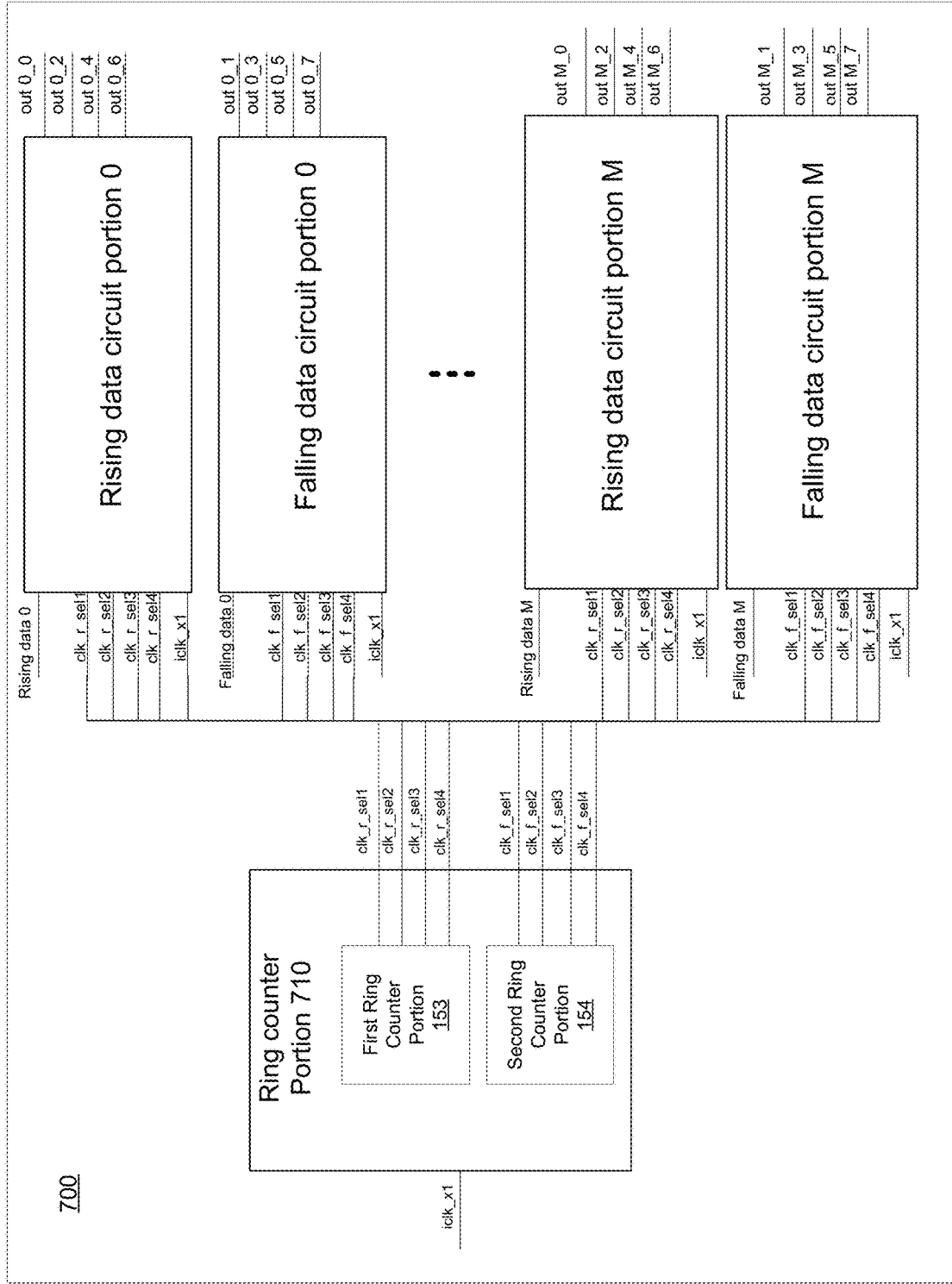
FIG. 7 illustrates an example of multiple 1 to 8 ring counter-based deserializers including a shared ring counter portion, in accordance with embodiments of the present disclosure.

FIG. 7 illustrates an example of a ring counter-based deserializer circuit 700 including multiple rising data circuit portions (rising data circuit portions 0 to M) and multiple falling data circuit portions (falling data circuit portions 0 to M) using a shared ring counter portion 710, in accordance with embodiments of the present disclosure. As shown, the multiple rising data circuit portions (e.g., Rising Data Circuit Portion 0 . . . Rising Data Circuit Portion M) and multiple falling data circuit portions (e.g., Falling Data Circuit Portion 0 . . . Falling Data Circuit Portion M) share a ring counter portion 710 configured to provide sets of rising edge clock signals (e.g., clkr_sel1, clk_r_sel2, clk_r_sel3, and clk_r_sel4) and falling edge clock signals (e.g., clk_f_sel1, clk_f_sel2, clk_f_sel3, and clk_f_sel4) based on a common clock signal (e.g., iclk_x1). Advantageously, use of a common ring counter portion 710 to provide clocking signals to multiple 1 to 8 deserializer circuit portions provides for a reduction in space consumption.

Figure 8:
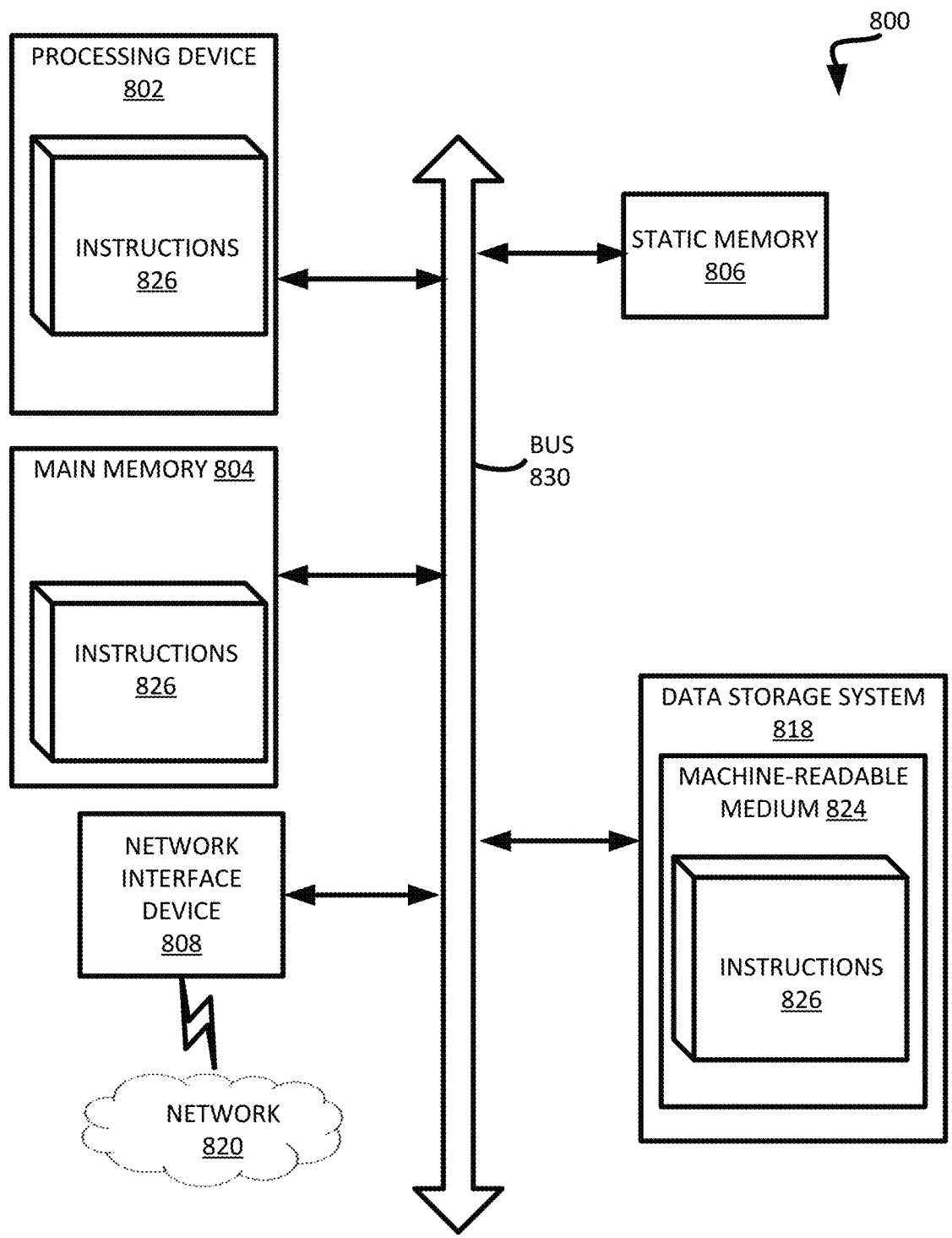
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to deserializer circuit 150 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium, such as a non-transitory computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to the deserializer circuit 150 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system comprising:
   a memory device comprising a circuit operatively coupled to an array data bus of a memory array; and
   control logic, operatively coupled with the circuit, to perform operations comprising:
      deserializing a serial data stream in a first time domain to generate at least one of a set of rising data portions or a set of falling data portions; and
      synchronizing the at least one of the set of rising data portions or the set of falling data portions in a second time domain using at least one of a set of rising edge clock signals or a set of falling edge clock signals generated by a ring counter portion.

2. The memory sub-system of claim 1, wherein the deserializing generates the set of rising data portions, and wherein the circuit comprises a first set of latch circuits, each of the first set of latch circuits receiving a respective rising data portion of the set of rising data portions and outputs the respective rising data portion in response to a respective rising edge clock signal of the set of rising edge clock signals.

3. The memory sub-system of claim 2, wherein the first set of latch circuits comprises:
   a first latch circuit to output a first rising data portion in response to a first rising edge clock signal of the set of rising edge clock signals; and
   a second latch circuit to receive the first rising data portion from the first latch circuit and output the first rising data portion to a first flip-flop circuit of a first set of flip-flop circuits in response to a second rising edge clock signal of the set of rising edge clock signals.

4. The memory sub-system of claim 1, wherein the deserializing generates the set of falling data portions, and wherein the circuit comprises a second set of latch circuits, each of the second set of latch circuits receiving a respective falling data portion of the set of falling data portions and outputs the respective falling data portion in response to a respective falling edge clock signal of the set of falling edge clock signals.

5. The memory sub-system of claim 4, wherein the circuit further comprises:
   a second set of flip-flop circuits, wherein each of the second set of flip-flop circuits receives a falling data portion of the set of falling data portions in response to a falling edge clock signal of the set of falling edge clock signals.

6. The memory sub-system of claim 3, wherein the circuit further comprises:
   a third set of flip-flop circuits, wherein the third set of flip-flop circuits outputs the set of rising data portions.

7. The memory sub-system of claim 4, wherein the circuit further comprises:
   a fourth set of flip-flop circuits, wherein the fourth set of flip-flop circuits outputs the set of falling data portions.

8. The memory sub-system of claim 6, wherein the third set of flip-flop circuits outputs the set of rising data portions in response to a common clock signal.

9. The memory sub-system of claim 7, wherein the fourth set of flip-flop circuits outputs the set of falling data portions in response to a common clock signal.

10. The memory sub-system of claim 1, wherein the synchronizing is based on a common clock signal.

11. The memory sub-system of claim 1, wherein the synchronizing further comprises using a common clock signal to sequentially output at least one of the set of rising edge clock signals or the set of falling edge clock signals based on a reference clock input.

12. A memory sub-system comprising:
   a memory device comprising a circuit operatively coupled to an array data bus of a memory array; and control logic, operatively coupled with the circuit, to perform operations comprising:
  deserializing a serial data stream in a first time domain to generate a set of rising data portions; and
  synchronizing the set of rising data portions in a second time domain using a set of rising edge clock signals generated by a ring counter portion.

13. The memory sub-system of claim 12, wherein the circuit comprises a set of latch circuits, each of the set of latch circuits receiving a respective rising data portion of the set of rising data portions and outputs the respective rising data portion in response to a respective rising edge clock signal of the set of rising edge clock signals.

14. The memory sub-system of claim 13, wherein the set of latch circuits comprises:
  a first latch circuit to output a first rising data portion in response to a first rising edge clock signal of the set of rising edge clock signals; and
  a second latch circuit to receive the first rising data portion from the first latch circuit and output the first rising data portion to a first flip-flop circuit of a first set of flip-flop circuits in response to a second rising edge clock signal of the set of rising edge clock signals.

15. The memory sub-system of claim 14, wherein the circuit further comprises:
  a second set of flip-flop circuits, wherein the second set of flip-flop circuits outputs the set of rising data portions.

16. The memory sub-system of claim 15, wherein the second set of flip-flop circuits outputs the set of rising data portions in response to a common clock signal.

17. A memory sub-system comprising:
  a memory device comprising a circuit operatively coupled to an array data bus of a memory array; and
  control logic, operatively coupled with the circuit, to perform operations comprising:
    deserializing a serial data stream in a first time domain to generate a set of falling data portions; and
    synchronizing the set of falling data portions in a second time domain using a set of falling edge clock signals generated by a ring counter portion.

18. The memory sub-system of claim 17, wherein the circuit comprises a set of latch circuits, each of the set of latch circuits receiving a respective falling data portion of the set of falling data portions and outputs the respective falling data portion in response to a respective falling edge clock signal of the set of falling edge clock signals.

19. The memory sub-system of claim 18, wherein the circuit further comprises:
  a first set of flip-flop circuits, wherein each of the first set of flip-flop circuits receives a falling data portion of the set of falling data portions in response to a falling edge clock signal of the set of falling edge clock signals.

20. The memory sub-system of claim 19, wherein the circuit further comprises:
  a second set of flip-flop circuits, wherein the second set of flip-flop circuits outputs the set of falling data portions.

* * * * *